(12) United States Patent
Waters et al.

(10) Patent No.: US 12,647,117 B2
(45) Date of Patent: Jun. 2, 2026

(54) LEVEL SHIFTER WITH AUTOMATIC DIRECTION SENSING

(71) Applicant: TEXAS INSTRUMENTS INCORPORATED, Dallas, TX (US)

(72) Inventors: Deric Wayne Waters, Dallas, TX (US); Roland Son, Richardson, TX (US); Sualp Aras, Dallas, TX (US); Ralph Braxton Wade, III, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 24 days.

(21) Appl. No.: 18/611,223

(22) Filed: Mar. 20, 2024

(65) Prior Publication Data

US 2024/0250685 A1     Jul. 25, 2024

Related U.S. Application Data

(63) Continuation of application No. 18/059,764, filed on Nov. 29, 2022, now Pat. No. 11,973,499.

(51) Int. Cl.
    *H03K 19/0185*     (2006.01)
    *G01R 19/10*     (2006.01)

(52) U.S. Cl.
    CPC ..... *H03K 19/018592* (2013.01); *G01R 19/10* (2013.01); *H03K 19/018507* (2013.01)

(58) Field of Classification Search
    CPC ................ H03K 19/01759; H03K 19/018592
    See application file for complete search history.

(56) References Cited

U.S. PATENT DOCUMENTS

| | | | |
|---|---|---|---|
| 7,639,045 B2 | 12/2009 | Motamed | |
| 7,839,172 B2 | 11/2010 | Hori | |
| 7,882,279 B2 * | 2/2011 | Takehara | H03K 19/01759 |
| | | | 710/110 |
| 7,928,766 B2 | 4/2011 | Welty | |
| 2004/0225793 A1 | 11/2004 | Hunter et al. | |
| 2006/0022702 A1 | 2/2006 | Tokuhiro | |
| 2008/0150581 A1 | 6/2008 | Huang et al. | |
| 2009/0153193 A1 | 6/2009 | Aranovsky | |

OTHER PUBLICATIONS

International Search Report and Written Opinion mailed May 24, 2024, PCT Application No. PCT/US2023/081559, 16 pages.
Partial Search Report dated Mar. 25, 2024, PCT Application No. PCT/US2023/081559, 7 pages.

* cited by examiner

*Primary Examiner* — Jeffrey S Zweizig
(74) *Attorney, Agent, or Firm* — Frank D. Cimino

(57) ABSTRACT

A bidirectional level shifter circuit includes first and second driver circuits, first and second comparators, and a control circuit. The first driver circuit includes a first driver output and a first enable input. The second driver circuit includes a second driver output and a second enable input. The first comparator includes a first comparator output, a first reference input, and a first comparator input that is coupled to the second driver output. The second comparator includes a second comparator output, a second reference input, and a second comparator input is coupled to the first driver output. The control circuit includes a first control input coupled to the first comparator output, a second control input coupled to the second comparator output, a first control output coupled to the first enable input, and a second control output coupled to the second enable input.

20 Claims, 5 Drawing Sheets

LEVEL SHIFTER WITH AUTOMATIC DIRECTION SENSING

CROSS-REFERENCE TO RELATED APPLICATIONS

The present application is a continuation to U.S. patent application Ser. No. 18/059,764 filed Nov. 29, 2022, is titled "Level Shifter with Automatic Direction Sensing," and is hereby incorporated herein by reference in its entirety.

BACKGROUND

Electronic systems often have circuits that are powered by different power supply voltages, or that require different signal levels to activate circuit components. In such systems, level shifter circuits (level shifters) are used to translate signals from one voltage level to another. For example, a level shifter may be used to translate a signal from a lower voltage to a higher voltage, or to translate a signal from a higher voltage to a lower voltage.

SUMMARY

In one example, a bidirectional level shifter circuit includes a first driver circuit, a second driver circuit, a first comparator, a second comparator, and a control circuit. The first driver circuit includes a first driver output and a first enable input. The second driver circuit includes a second driver output and a second enable input. The first comparator includes a first comparator output, a first comparator input, and a first reference input. The first comparator input is coupled to the second driver output. The second comparator includes a second comparator output, a second comparator input, and a second reference input. The second comparator input is coupled to the first driver output. The control circuit includes a first control input, a second control input, a first control output, and a second control output. The first control input is coupled to the first comparator output. The second control input is coupled to the second comparator output. The first control output is coupled to the first enable input. The second control output is coupled to the second enable input.

In another example, a bidirectional level shifter circuit includes a first driver circuit, a second driver circuit, a first comparator, a second comparator, and a control circuit. The first driver circuit is configured to drive a first input/output (I/O) terminal to a first voltage. The second driver circuit is configured to drive a second I/O terminal to a second voltage that is different from the first voltage. The first comparator has a first comparator output. The first comparator is coupled to the first driver circuit. The first comparator is configured to compare a signal at the first I/O terminal to a first threshold. The second comparator having a second comparator output. The second comparator is coupled to the second driver circuit. The second comparator is configured to compare a signal at the second I/O terminal to a second threshold that is different from the first threshold. The control circuit is coupled to the first driver circuit, the second driver circuit, the first comparator, and the second comparator. The control circuit is configured to enable the first driver circuit responsive to a falling edge at the second comparator output, and enable the second driver circuit responsive to a falling edge at the first comparator output.

In a further example, a serial bus re-timer circuit includes re-timer and a bidirectional level shifter circuit. The bidirectional level shifter circuit is coupled to the re-timer. The bidirectional level shifter circuit includes a first driver circuit, a second driver circuit, a first comparator, a second comparator, and a control circuit. The first driver circuit is configured to drive a first I/O terminal to a first voltage. The second driver circuit is configured to drive a second I/O terminal to a second voltage that is different from the first voltage. The first comparator has a first comparator output. The first comparator is coupled to the first driver circuit. The first comparator is configured to compare a signal at the first I/O terminal to a first threshold. The second comparator has a second comparator output. The second comparator is coupled to the second driver circuit. The second comparator is configured to compare a signal at the second I/O terminal to a second threshold that is different from the first threshold. The control circuit is coupled to the first driver circuit, the second driver circuit, the first comparator, and the second comparator. The control circuit is configured to enable the first driver circuit responsive to a falling edge at the second comparator output, and enable the second driver circuit responsive to a falling edge at the first comparator output.

DETAILED DESCRIPTION

Figure 1:
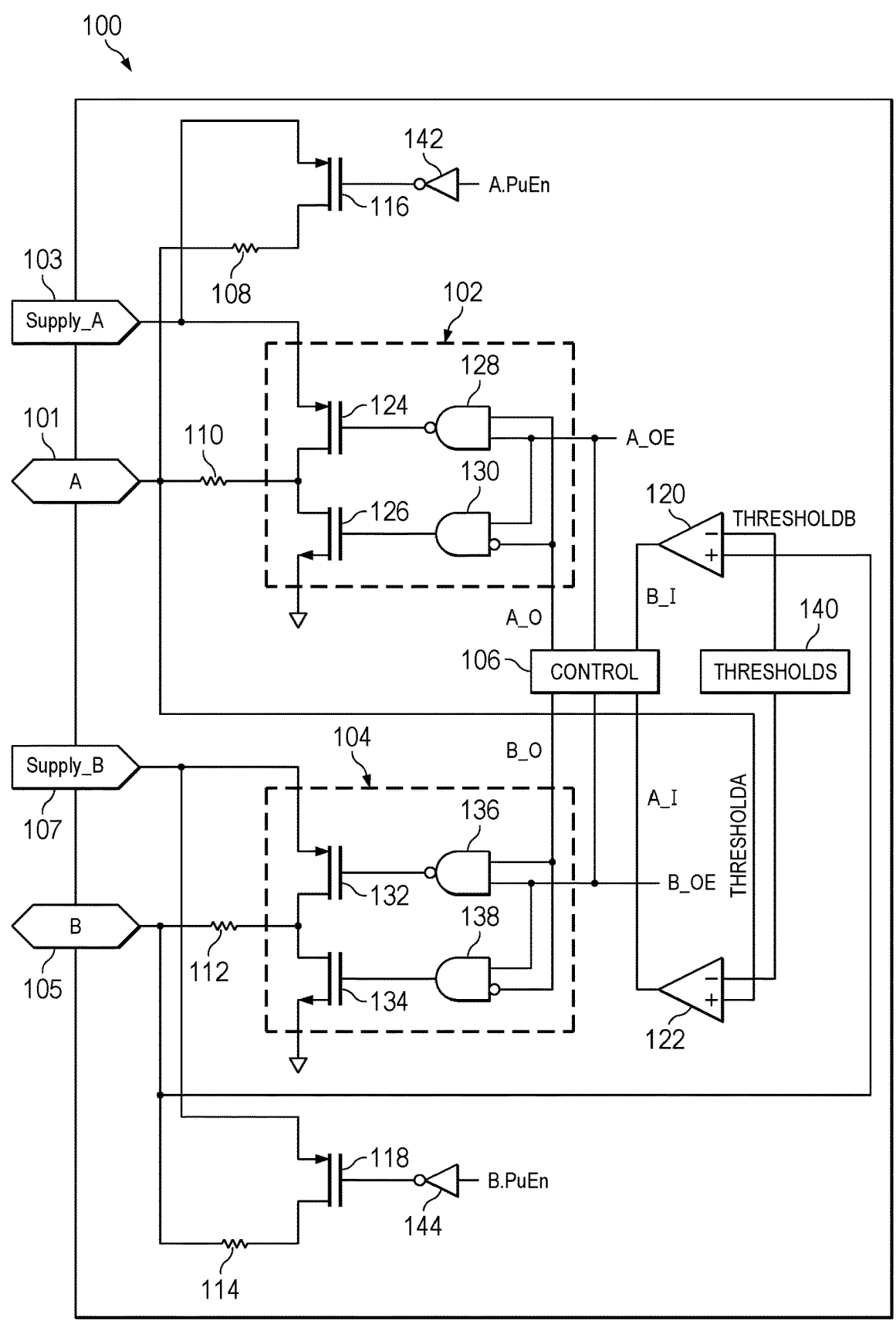
FIG. 1 is a block diagram of an example bidirectional level shifter circuit that autonomously determines drive direction.

FIG. 1 is a block diagram of an example bidirectional level shifter circuit 100 that autonomously determines drive direction. The bidirectional level shifter circuit 100 includes a driver circuit 102, a driver circuit 104, a control circuit 106, a resistor 108, a resistor 110, a resistor 112, a resistor 114, a transistor 116, a transistor 118, a comparator 120, a comparator 122, and a thresholds circuit 140. The driver circuit 102 is coupled to a first input/output (I/O) terminal 101 and a first power supply terminal 103. The driver circuit 102 drives the I/O terminal 101 to first voltage received at the power supply terminal 103. The driver circuit 104 is coupled to a second I/O terminal 105 and a second power supply terminal 107. The driver circuit 104 drives the I/O terminal 105 to a second voltage received at the power supply terminal 107.

The transistor 116 includes a first current terminal (e.g., source) coupled to the power supply terminal 103, and a second current terminal (e.g., drain) coupled to the I/O terminal 101. The resistor 108 is coupled between the second current terminal of the transistor 116 and the I/O terminal 101. A control terminal (e.g., gate) of the transistor 116 is coupled to an inverter 142. The input of the inverter 142 may be pulled to a logic high to turn on the transistor 116. The transistor 118 includes a first current terminal (e.g., source) coupled to the power supply terminal 107, and a second current terminal (e.g., drain) coupled to the I/O terminal 105. The resistor 114 is coupled between the second current terminal of the transistor 118 and the I/O terminal 105. A control terminal (e.g., gate) of the transistor 118 is coupled to an inverter 144. The input of the inverter 144 may be pulled to a logic high to turn on the transistor 118. The resistor 108 and the resistor 114 may have a value of about 10 kiloohms in some implementations of the bidirectional level shifter circuit 100, and the transistor 116 and the transistor 118 may be p-channel field effect transistors (PFETs).

The driver circuit 102 includes a transistor 124, a transistor 126, a logic gate 128, and a logic gate 130. The transistor 124 and the transistor 126 provide push-pull drive to the I/O terminal 101. Some implementations of the driver circuit 102 and the driver circuit 104 may provide an open-drain output. The logic gate 128 controls the transistor 124, and the logic gate 130 controls the transistor 126. The transistor 124 includes a first current terminal (e.g., source) coupled to the power supply terminal 103, and serving as a power input of the driver circuit 102. The transistor 124 has a second current terminal (e.g., drain) coupled to the I/O terminal 101. A control terminal (e.g., gate) of the transistor 124 is coupled to an output of the logic gate 128. The transistor 126 includes a first current terminal (e.g., drain) coupled to the second current terminal of the transistor 124. A second current terminal (e.g., source) of the transistor 126 is coupled to a ground terminal. A control terminal (e.g., gate) of the transistor 126 is coupled to an output of the logic gate 130. The resistor 110 is coupled between the second current terminal of the transistor 124 and the I/O terminal 101. The resistor 110 may have a resistance that is smaller than the resistance of the resistor 108. For example, the resistor 110 may have a resistance of about 50 ohms (e.g., 25-90 ohms). The transistor 124 may be a PFET and the transistor 126 may be an n-channel field effect transistor (NFET).

The driver circuit 102 includes a signal input and an enable input. The signal input is coupled to the control circuit 106 for receipt of a transmit signal (A_O) to be driven by the driver circuit 102. The enable input is coupled to the control circuit 106 for receipt of an enable signal that enables or disables the driver circuit 102. The logic gate 128 includes a first input coupled to the signal input and a second input coupled to the enable input. The logic gate 128 turns on the transistor 124 if the enable signal is a logic high voltage and the transmit signal is a logic high voltage. The logic gate 130 includes a first input coupled to the signal input and a second input coupled to the enable input. The logic gate 130 turns on the transistor 126 if the enable signal is a logic high voltage and the transmit signal is a logic low voltage.

The driver circuit 104 includes a transistor 132, a transistor 134, a logic gate 136, and a logic gate 138. The transistor 132 and the transistor 134 provide push-pull drive to the I/O terminal 105. The logic gate 136 controls the transistor 132, and the logic gate 138 controls the transistor 134. The transistor 132 includes a first current terminal (e.g., source) coupled to the power supply terminal 107, and serving as a power input of the driver circuit 104. The transistor 132 has a second current terminal (e.g., drain) coupled to the I/O terminal 105. A control terminal (e.g., gate) of the transistor 132 is coupled to an output of the logic gate 136. The transistor 134 includes a first current terminal (e.g., drain) coupled to the second current terminal of the transistor 132. A second current terminal (e.g., source) of the transistor 134 is coupled to a ground terminal. A control terminal (e.g., gate) of the transistor 134 is coupled to an output of the logic gate 138. The resistor 112 is coupled between the second current terminal of the transistor 132 and the I/O terminal 105. The resistor 112 may have a resistance that is smaller than the resistance of the resistor 114. For example, the resistor 112 may have a resistance of about 50 ohms (e.g., 25-90 ohms). The transistor 132 may be a PFET and the transistor 134 may be an NFET.

The driver circuit 104 includes a signal input and an enable input. The signal input is coupled to the control circuit 106 for receipt of a transmit signal (B_O) to be driven by the driver circuit 104. The enable input is coupled to the control circuit 106 for receipt of an enable signal that enables or disables the driver circuit 104. The logic gate 136 includes a first input coupled to the signal input and a second input coupled to the enable input. The logic gate 136 turns on the transistor 132 if the enable signal is a logic high voltage and the transmit signal is logic high voltage. The logic gate 138 includes a first input coupled to the signal input and a second input coupled to the enable input. The logic gate 138 turns on the transistor 134 if the enable signal is a logic high voltage and the transmit signal is a logic low voltage.

The comparator 120 compares the voltage at the I/O terminal 105 to a first threshold voltage. The comparator 120 includes a first input coupled to the I/O terminal 105 and a second input coupled to an output of the thresholds circuit 140. An output of the comparator 120 is coupled to a first control input of the control circuit 106. The comparator 122 compares the voltage at the I/O terminal 101 to a second threshold voltage. The comparator 122 includes a first input coupled to the I/O terminal 101 and a second input coupled to an output of the thresholds circuit 140. An output of the comparator 122 is coupled to a second control input of the control circuit 106.

The thresholds circuit 140 provides threshold voltages to the comparator 120 and the comparator 122. The threshold voltage provided to the comparator 120 are different from the threshold voltage provided to the comparator 122. The thresholds circuit 140 may include voltage reference circuitry and voltage divider circuitry to generate the reference voltages provided to the comparator 120 and the comparator 122. The thresholds applied in the comparator 120 and the comparator 122 may be slightly different from the threshold voltages received from the threshold circuit 140 to provide hysteresis.

The control circuit 106 autonomously determines the direction of signal flow through the bidirectional level shifter circuit 100 (e.g., from the I/O terminal 101 to the I/O terminal 105, or from the I/O terminal 105 to the I/O terminal 101) and enables the driver circuit 102 and the driver circuit 104 as needed to provide signal flow in the proper direction. The control circuit 106 includes a first control input, a second control input, a first enable output, a second enable output, a first signal output, and a second signal output. The first control input is coupled to the comparator output of the comparator 120, and the second control input is coupled to the comparator output of the comparator 122. The first enable output is coupled to the enable input of the driver circuit 102, and the second enable output is coupled to the enable input of the driver circuit 104. The first signal output is coupled to the signal input of the driver circuit 102, and the second signal output is coupled to the signal input of the driver circuit 104. The control circuit 106 provides the transmit signal A_O at the first signal output, and provides the transmit signal B_O at the second signal output. The transmit signal A_O may follow the signal B_I received from the comparator 120, and the transmit signal B_O may follow the signal A_I received from the comparator 122. The control circuit 106 determines the direction of signal flow based on a falling edge provided by the comparator 120 or the comparator 122, enables the driver circuit 102 or the driver circuit 104 to provide output signal in the selected direction, and maintains signal flow in the selected direction until no falling edges are detected within a time-out interval following a rising edge.

Some bidirectional level shifters require external control of the signal direction via a control interface, such as a serial control bus. The time needed to set the direction of signal propagation such bidirectional level shifters can adversely impact system timing, and implementation of the serial control bus may require additional I/O pins, which increases cost. In contrast, the bidirectional level shifter circuit 100 does not degrade system timing, and requires no serial control bus pins. Other bidirectional level shifters use one-shot circuitry to replicate detected edges, and apply a weak pull-up or pull-down to hold the signal level after the pulse is generated by the one-shot. The weak pull-down used with the one-shot circuitry is incompatible with the pull-up resistors 108 and 114 of the bidirectional level shifter circuit 100, and the bidirectional level shifter circuit 100 is less complex than level shifters using one-shot circuitry.

Figure 2:
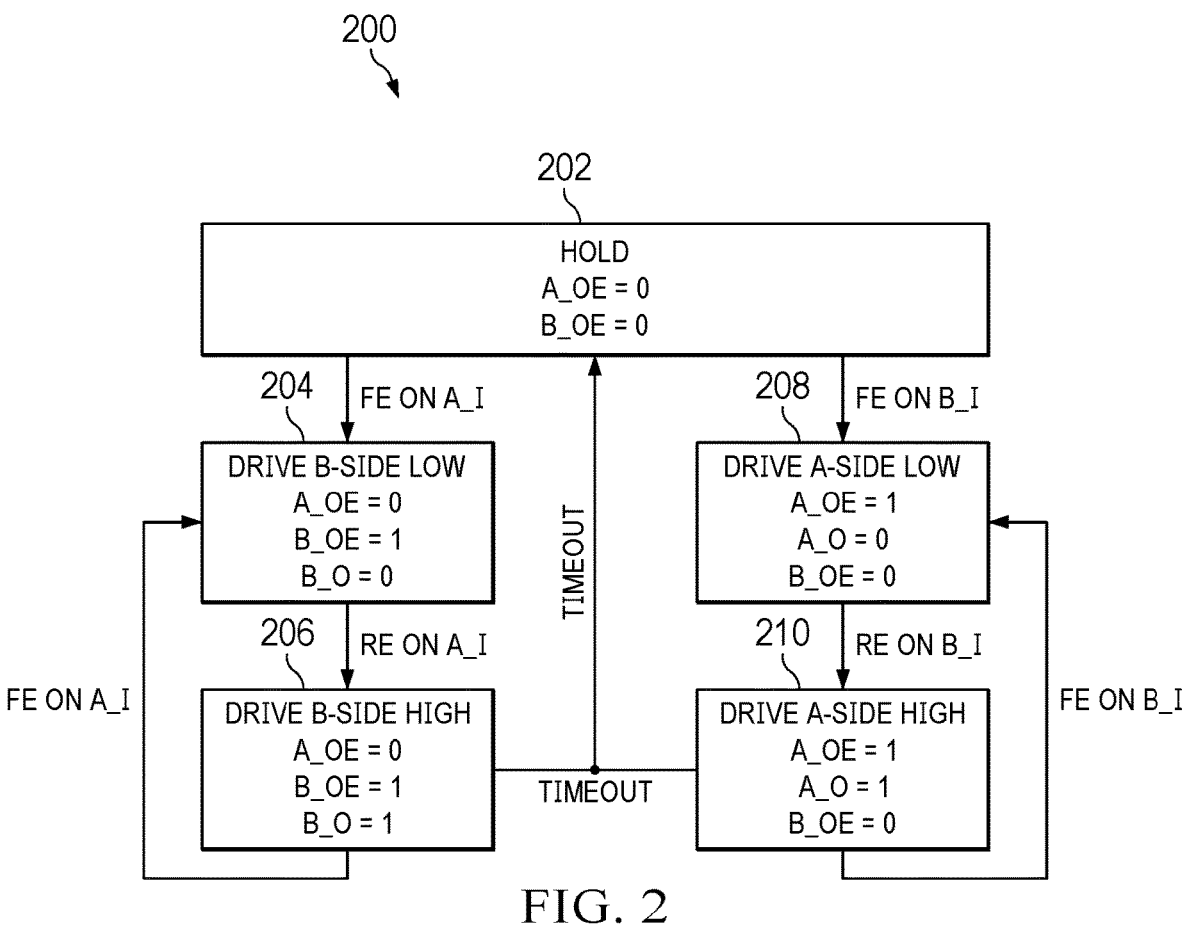
FIG. 2 is a state diagram for an example control method of the bidirectional level shifter of FIG. 1.

FIG. 2 is a state diagram 200 for an example control method performed by the control circuit 106. The operations of the state diagram 200 may be implemented by a state machine of the control circuit 106. In block 202, the control circuit 106 is in a Hold state and monitors the first and second control inputs for a falling edge on the comparator output signal A_I or the comparator output signal B_I. In the Hold state, the control circuit 106 provides the enable signal (A_OE) and the enable signal (B_OE) in a disable state (e.g., logic low) to disable the driver circuit 102 and the driver circuit 104.

If the control circuit 106 detects a falling edge on the comparator output signal A_I in block 202, the control circuit 106 transitions from the Hold state to the Drive B Side Low state in block 204. In block 204, the control circuit 106 provides A_OE in a disable state (e.g., logic low) to disable the driver circuit 102, and provides B_OE in an enable state (e.g., logic high) to enable the driver circuit 104. The control circuit 106 may drive B_O to provide a transmit signal having a low logic level to the signal input of the driver circuit 104. The control circuit 106 monitors the comparator output signal A_I for a subsequent rising edge in block 204.

If the control circuit 106 detects a rising edge on the comparator output signal A_I in block 204, the control circuit 106 transitions from the Drive B Side Low state to the Drive B Side High state in block 206. In block 206, the control circuit 106 initiates a time-out timer, provides A_OE in a disable state (e.g., logic low) to disable the driver circuit 102, and provides B_OE in an enable state (e.g., logic high) to enable the driver circuit 104. The time-out interval may be about 1 micro-second in some examples. The control circuit 106 may drive B_O to provide a transmit signal having a high logic level to the signal input of the driver circuit 104. The control circuit 106 monitors the comparator output signal A_I for a falling edge in block 206.

If the control circuit 106 detects a falling edge on A_I before the time-out expires, then the control circuit 106 transitions from the Drive B Side High state to the Drive B Side Low state in block 204. If the control circuit 106 does not detect a falling edge on A_I before the time-out expires, then the control circuit 106 transitions from the from the Drive B Side High state to the Hold state in block 202.

If the control circuit 106 detects a falling edge on the comparator output signal B_I in block 202, the control circuit 106 transitions from the Hold state to the Drive A Side Low state in block 208. In block 208, the control circuit 106 provides B_OE in a disable state (e.g., logic low) to disable the driver circuit 104, and provides A_OE in an enable state (e.g., logic high) to enable the driver circuit 102. The control circuit 106 may drive A_O to provide a transmit signal having a low logic level to the signal input of the driver circuit 102. The control circuit 106 monitors the comparator output signal B_I for a rising edge in block 208.

If the control circuit 106 detects a rising edge on the comparator output signal B_I in block 208, the control circuit 106 transitions from the Drive A Side Low state to the Drive A Side High state in block 210. In block 210, the control circuit 106 starts a time-out timer, provides B_OE in a disable state (e.g., logic low) to disable the driver circuit 104, and provides A_OE in an enable state (e.g., logic high) to enable the driver circuit 102. The time-out interval may be about 1 micro-second in some examples. The control circuit 106 may drive A_O to provide a transmit signal having a high logic level to the signal input of the driver circuit 102. The control circuit 106 monitors the comparator output signal B_I for a falling edge in block 210.

If the control circuit 106 detects a falling edge on B_I before the time-out expires, then the control circuit 106 transitions from the from the Drive A Side High state to the Drive A Side Low state in block 208. If the control circuit 106 does not detect a falling edge on B_I before the time-out expires, then the control circuit 106 transitions from the Drive A Side High state to the Hold state in block 202.

Figure 3:
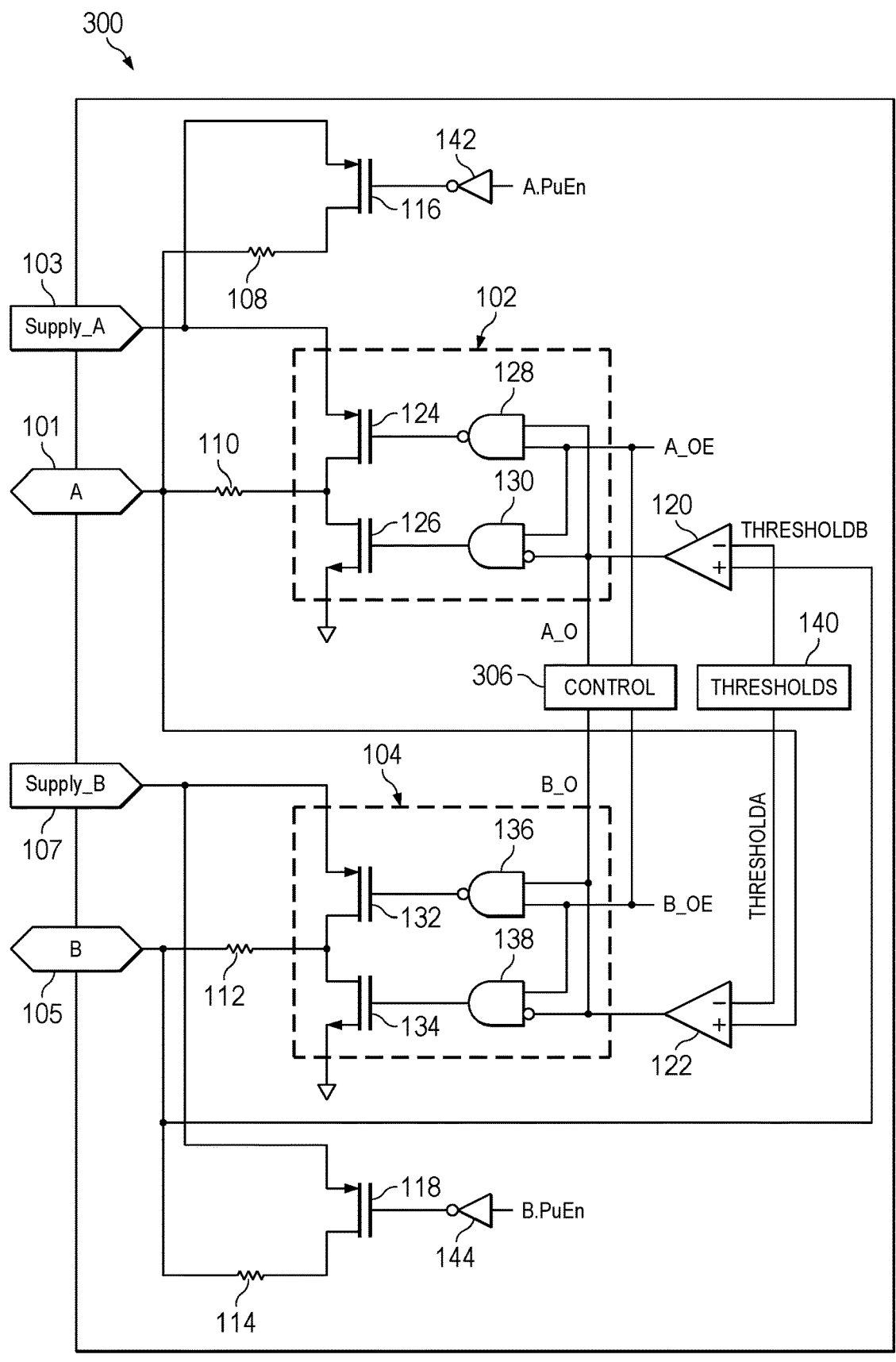
FIG. 3 is a block diagram of another example bidirectional level shifter circuit that autonomously determines drive direction.

FIG. 3 is a block diagram of another example bidirectional level shifter circuit 300 that autonomously determines drive direction. The bidirectional level shifter circuit 300 is similar to the bidirectional level shifter circuit 100. The bidirectional level shifter circuit 300 includes a control circuit 306 in place of the control circuit 106. The control circuit 306 is similar to the control circuit 106, but may lack the first and second signal outputs of the control circuit 106. In the bidirectional level shifter circuit 300, the output of the comparator 120 is coupled to the signal input of the driver circuit 102, and the output of the comparator 122 is coupled to the signal input of the driver circuit 104. The driver circuit 102, the driver circuit 104, the comparator 120, and the comparator 122 operate in the bidirectional level shifter circuit 300 as described with respect to the bidirectional level shifter circuit 100.

As in the control circuit 106, the control circuit 306 autonomously determines the direction of signal flow through the bidirectional level shifter circuit 300 (e.g., from the I/O terminal 101 to the I/O terminal 105, or from the I/O terminal 105 to the I/O terminal 101) and enables the driver circuit 102 and the driver circuit 104 as needed to provide signal flow in the proper direction. The control circuit 306 is not part of the signal path between the I/O terminal 101 and the I/O terminal 105, so the control circuit 306 does not increase the propagation time of signal passing through the bidirectional level shifter circuit 300. Accordingly, the propagation delay of the bidirectional level shifter circuit 300 may be less than the propagation delay of the bidirectional level shifter circuit 100. The control circuit 306 includes the first control input, the second control input, the first enable output, and the second enable output. The first control input is coupled to the comparator output of the comparator 120, and the second control input is coupled to the comparator output of the comparator 122. The first enable output is coupled to the enable input of the driver circuit 102, and the second enable output is coupled to the enable input of the driver circuit 104. The control circuit 306 determines the direction of signal flow based on a falling edge provided by the comparator 120 or the comparator 122, enables the driver circuit 102 or the driver circuit 104 to provide output signal in the selected direction, and maintains signal flow in the selected direction until no falling edges are detected within a time-out interval following a rising edge.

Figure 4:
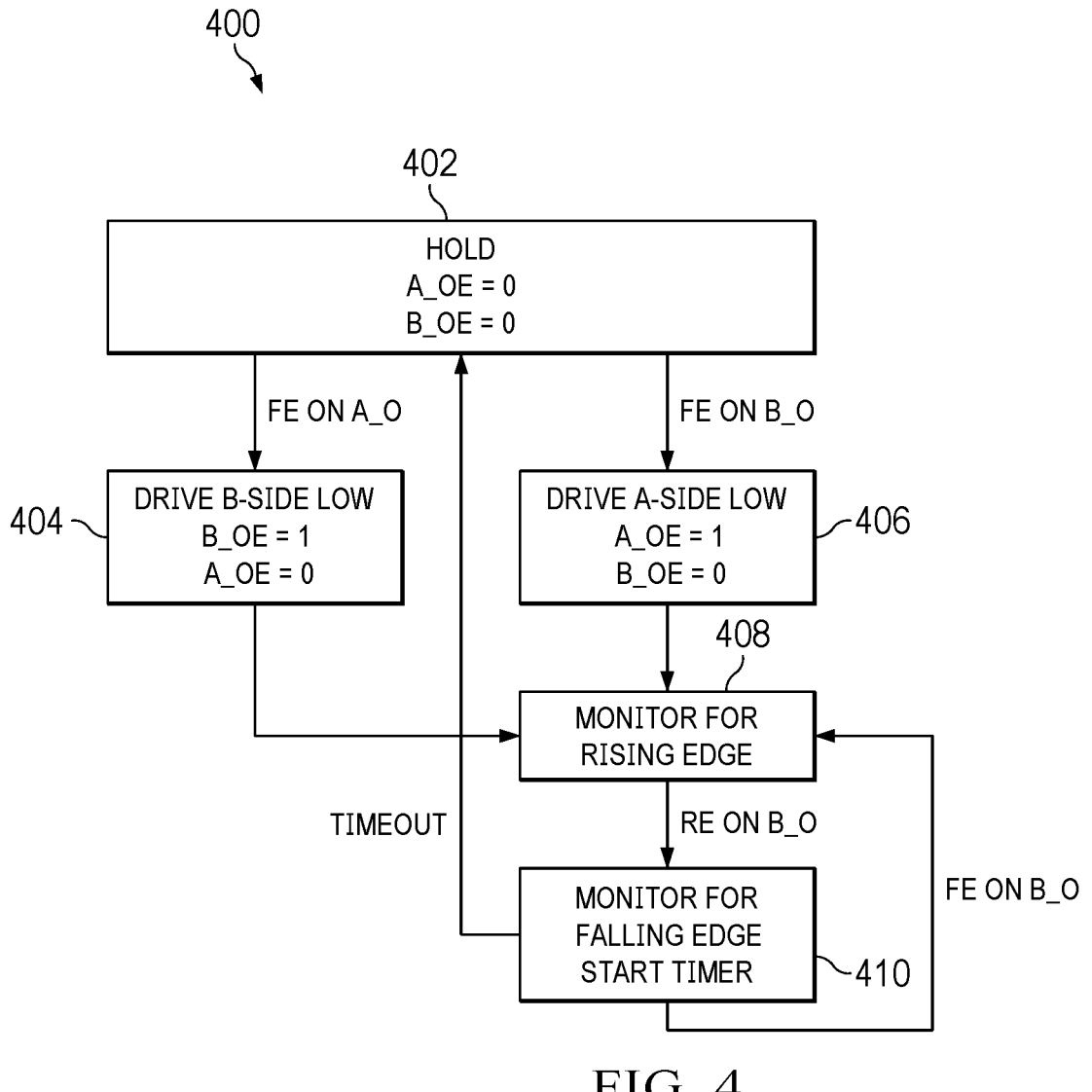
FIG. 4 is a state diagram for an example control method of the bidirectional level shifter of FIG. 3.

FIG. 4 is a state diagram 400 for an example control method performed by the control circuit 306. The operations of the state diagram 400 may be implemented by a state machine of the control circuit 306. In block 402, the control circuit 306 is in the Hold state and monitors the first and second control inputs for a falling edge on the comparator output signal A_O or the comparator output signal B_O. In the Hold state, the control circuit 306 provides the enable signal (A_OE) and the enable signal (B_OE) in a disable state (e.g., logic low) to disable the driver circuit 102 and the driver circuit 104.

If the control circuit 306 detects a falling edge on the comparator output signal A_O in block 402, the control circuit 306 transitions from the hold state to the Drive B Side Low state in block 404. In block 404, the control circuit 306 provides A_OE in a disable state (e.g., logic low) to disable the driver circuit 102, provides B_OE in an enable state (e.g., logic high) to enable the driver circuit 104, and transitions to the Monitor for Rising Edge state in block 408.

In block 408, the control circuit 306 monitors A_O or B_O for a rising edge. Either A_O or B_O can be monitored because the time difference between the two is small. If the control circuit 306 detects a rising edge in block 408, then the control circuit 306 transitions from the Monitor for Rising Edge state to the Monitor for Falling Edge state in block 410.

In block 410, the control circuit 306 starts a time-out timer and monitors A_O or B_O for a falling edge. The time-out interval may be about 1 micro-second in some examples. If a falling edge is detected before the time-out expires, then the control circuit 306 transitions from the Monitor for Falling Edge state to the Monitor for Rising Edge state in block 408. If the control circuit 306 does not detect a falling edge before the time-out expires, then the control circuit 306 transitions from the from the Monitor for Falling Edge state to the Hold state in block 402.

Figures 5, 6:
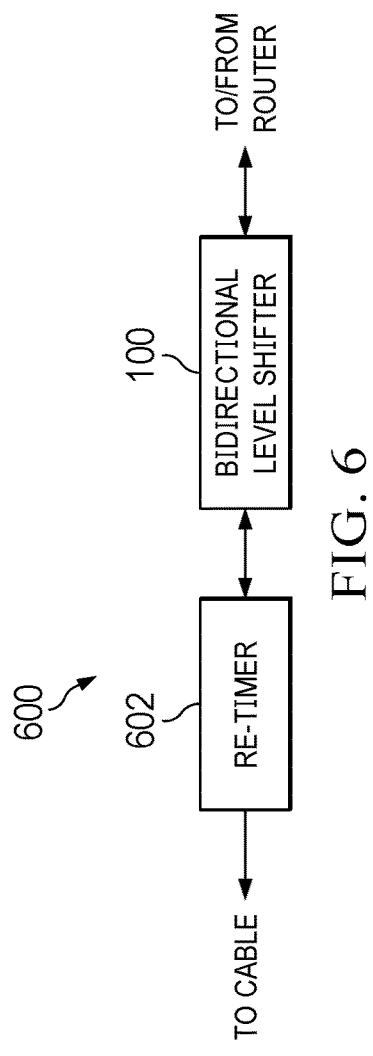
FIG. 5 is a signal diagram illustrating example state changes during signal propagation in the bidirectional level shifter of FIG. 1 or FIG. 3.
FIG. 6 is a block diagram of an example serial bus re-timer circuit that includes the bidirectional level shifter of FIG. 1 or FIG. 3.

FIG. 5 is a signal diagram illustrating example state changes during signal propagation in the bidirectional level shifter circuit 100. While the signal illustrated in FIG. 5 is described as received at the I/O terminal 101 and driven at the I/O terminal 105, the description also applies to reception at the I/O terminal 105. In the interval 502, the control circuit 106 is operating in the Hold state of block 202, and awaiting a falling edge on A_I or B_I. At falling edge 504 of B_I, the control circuit 106 transitions from the Hold state to the Drive A-Side Low State of block 208, and awaits a rising edge on B_I. At rising edge 506 of B_I, the control circuit 106 transitions from the Drive A-Side Low State of block 208 to the Drive A-Side High State of block 210, starts the time-out timer, and awaits a falling edge on B_I or expiration of the time-out. With edges 508, 510, 512, 514, 516, and 518, the control circuit 106 continues to transition between the Drive A-Side Low State of block 208 and the Drive A-Side High State of block 210. In the interval 520, the control circuit 106 is in the Drive A-Side High State of block 210, the time-out expires (B_I includes no falling edge in the interval 520), and the control circuit 106 transitions from the Drive A-Side High State of block 210 to the Hold State of block 202. While the description of FIG. 5 explains state change by reference to the state diagram 200, state changes in the state diagram 400 are similar.

FIG. 6 is a block diagram of an example serial bus re-timer circuit 600. The serial bus re-timer circuit 600 includes a re-timer 602 and the bidirectional level shifter circuit 100. The re-timer 602 drives signals onto a cable or other device. The bidirectional level shifter circuit 100 is coupled between the re-timer 602 and an external device (not shown), such as a router. In some implementations of the 600, the bidirectional level shifter circuit 100 provides level shifting for signals of a sideband channel used to configure and manage the re-timer 602. For example, registers of the re-timer 602 may be accessed via the sideband channel. The bidirectional level shifter circuit 100 communicates with the re-timer 602 via signals having a first voltage level (e.g., 1.5 volts), and communicates with the router via signals having a second voltage level (e.g., 3.3 volts). The bidirectional level shifter circuit 100 autonomously determines the direction of signal propagation (from the router to the re-timer 602, or from the re-timer 602 to the router), and provides output signals at the appropriate voltages.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hard wired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A circuit comprising:
a first terminal;
a second terminal; and
a control circuit configurable to:
   responsive to a signal level at the first terminal exceeding a first threshold voltage, set a state of the second terminal; and
   responsive to a signal level at the second terminal exceeding a second threshold voltage, set a state of the first terminal.

2. The circuit of claim 1, further comprising:
a first comparator having first and second inputs and an output, the first input of the first comparator coupled to the first terminal, the first comparator configurable to provide a signal at its output indicating whether the signal level at the first terminal exceeds the first threshold voltage; and
a second comparator having first and second inputs and an output, the first input of the second comparator coupled to the second terminal, the second comparator configurable to provide a signal at its output indicating whether the signal level at the first terminal exceeds the first threshold voltage.

3. The circuit of claim 2, further comprising a thresholds circuit having a first output and a second output, the first output coupled to the second input of the first comparator and configurable to provide the first threshold voltage, and the second output coupled to the second input of the second comparator and configurable to provide the second threshold voltage.

4. The circuit of claim 1, further comprising:
a first driver circuit having an input and an output, the input coupled to a first output of the control circuit, the output coupled to the first terminal; and
a second driver circuit having an input and an output, the input coupled to a second output of the control circuit, the output coupled to the second terminal.

5. The circuit of claim 4, wherein:
the first driver circuit includes first and second transistors coupled in series between a first supply terminal and a ground terminal, the first and second transistors connected at a terminal coupled to the first terminal; and
the second driver circuit includes third and fourth transistors coupled in series between a second supply terminal and the ground terminal, the third and fourth transistors connected at a terminal coupled to the second terminal.

6. The circuit of claim 1, wherein the first threshold voltage is higher than the second threshold voltage.

7. The circuit of claim 2, wherein the control circuit is configurable to monitor the outputs of the first and second comparators for a rising edge or a falling edge at the first terminal or second terminal.

8. The circuit of claim 4, further comprising:
a first resistor coupled between the first terminal and the first driver circuit; and
a second resistor coupled between the second I/O terminal and the second driver circuit.

9. The circuit of claim 4, wherein the first driver circuit comprises:

a first logic gate having first and second inputs and an output;

a second logic gate having first and second inputs and an output, the first input of the second logic gate coupled to the second input of the first logic gate, and the second input of the second logic gate coupled to the first input of the first logic gate;

a first transistor having first and second terminals and a control terminal, the control terminal coupled to the output of the first logic gate, and the first terminal coupled to a supply terminal; and a second transistor having first and second terminals and a control terminal, the control terminal of the second transistor coupled to the output of the second logic gate, and the first terminal of the second transistor coupled to the second terminal of the first transistor.

10. A method comprising:

setting a first terminal and a second terminal to a first state;

receiving a first signal at the first terminal and a second signal at the second terminal;

monitoring the first and second terminals for data transmission by comparing the first signal to a first threshold and comparing the second signal to a second threshold; and responsive to the first signal dropping below the first threshold, setting the second terminal to a second state.

11. The method of claim 10, further comprising:

initiating a timer as the second terminal is set to the second state; and responsive to the timer expiring, setting the second terminal to the first state.

12. The method of claim 11, further comprising, responsive to the first signal rising above the first threshold, setting the second terminal to a third state.

13. The method of claim 12, further comprising:

responsive to the second signal dropping below the second threshold, setting the first terminal to a fourth state;

initiating the timer as the first terminal is set to the fourth state; and responsive to the timer expiring, setting the first terminal to the first state.

14. The method of claim 13, further comprising, responsive to the second signal rising above the second threshold, setting the first terminal to a fifth state.

15. The method of claim 10, wherein a first driver coupled to the first terminal and a second driver coupled to the second terminal are each disabled during the first state.

16. A method comprising:

setting a first terminal and a second terminal to a first state in which a first driver circuit coupled to the first terminal and a second driver circuit coupled to the second terminal are each disabled;

comparing a first signal at the first terminal to a first threshold using a first comparator;

comparing a second signal at the second terminal to a second threshold using a second comparator;

responsive to a falling edge at an output of the first comparator, setting the second terminal to a second state in which the second driver circuit is enabled and the first driver circuit is disabled; and responsive to a falling edge at an output of the second comparator, setting the first terminal to a third state in which the first driver circuit is enabled and the second driver circuit is disabled.

17. The method of claim 16, further comprising:

initiating a timer as the second terminal is set to the second state or the first terminal is set to the third state; and responsive to the timer expiring, disabling the first and second driver circuits.

18. The method of claim 17, further comprising:

responsive to a rising edge at the output of the first comparator, setting the second terminal to a fourth state in which the second driver circuit is enabled and the first driver circuit is disabled; and responsive to a rising edge at the output of the second comparator, setting the first terminal to a fifth state in which the first driver circuit is enabled and the second driver circuit is disabled.

19. The method of claim 16, wherein the first driver circuit and second driver circuit are each controlled by a control circuit having first and second inputs and first and second outputs, the first input coupled to the output of the first comparator, the second input coupled to the output of the second comparator, the first output coupled to the first driver circuit, and the second output coupled to the second driver circuit.

20. The method of claim 17, wherein the outputs of the first and second driver circuits are each open-drain outputs.

* * * * *